US012695395B2

(12) United States Patent
Sudo

(10) Patent No.: US 12,695,395 B2
(45) Date of Patent: Jul. 28, 2026

(54) CONTROLLER AND SELF-OSCILLATION DC-DC CONVERTER INCLUDING THE CONTROLLER

(71) Applicant: ABLIC Inc., Nagano (JP)

(72) Inventor: Minoru Sudo, Nagano (JP)

(73) Assignee: ABLIC Inc., Nagano (JP)

( * ) Notice: Subject to any disclaimer, the term of this patent is extended or adjusted under 35 U.S.C. 154(b) by 183 days.

(21) Appl. No.: 18/592,534

(22) Filed: Mar. 1, 2024

(65) Prior Publication Data

US 2024/0313663 A1 Sep. 19, 2024

(30) Foreign Application Priority Data

Mar. 14, 2023 (JP) ................................. 2023-039284
Sep. 29, 2023 (JP) ................................. 2023-169283

(51) Int. Cl.
| | |
|---|---|
| *H02M 3/338* | (2006.01) |
| *H02M 1/088* | (2006.01) |
| *H03K 17/06* | (2006.01) |
| *H03K 17/30* | (2006.01) |

(52) U.S. Cl.
CPC ......... *H02M 3/3385* (2013.01); *H02M 1/088* (2013.01); *H03K 17/063* (2013.01); *H03K 17/302* (2013.01)

(58) Field of Classification Search
CPC .......... H02M 3/22; H02M 3/24; H02M 3/315; H02M 3/3155; H02M 3/335; H02M 3/33507; H02M 3/33515; H02M 3/33523; H02M 3/3353; H02M 3/33538; H02M 3/33546; H02M 3/33553; H02M 3/338; H02M 3/3382; H02M 3/3384; H02M 3/3381; H02M 3/3385; H02M 3/3387; H02M 3/3388; H02M 1/0025; H02M 1/0048; H02M 1/0054; H02M 1/08; H02M 1/088; H02M 1/32; H02M 1/34; H02M 1/36; H03K 17/06; H03K 17/063; H03K 17/30; H03K 17/302
USPC ... 363/15–21.18, 49, 50, 56.12, 74, 89, 123, 363/124, 147; 323/222–226, 266, (Continued)

(56) References Cited

U.S. PATENT DOCUMENTS

| | | | | |
|---|---|---|---|---|
| 9,325,250 | B2 * | 4/2016 | Salerno .................. | H02M 1/10 |
| 11,606,024 | B2 * | 3/2023 | Dillersberger ........ | H02M 3/338 |

(Continued)

FOREIGN PATENT DOCUMENTS

| | | |
|---|---|---|
| JP | 2005304231 | 10/2005 |

*Primary Examiner* — Carlos O Rivera-Perez
(74) *Attorney, Agent, or Firm* — JCIPRNET

(57) ABSTRACT

A controller includes: first to third input terminals; connection terminals; an output terminal; a first rectifying element, connected between the first input terminal and the second input terminal with a direction from the second input terminal to the first input terminal as a forward direction; a second rectifying element, connected between a connection point between the first input terminal and the first rectifying element and the output terminal with a direction from the connection point to the output terminal as a forward direction; an FET circuit, including a first depletion type FET and at least one other FET; a resistor, connected to the second input terminal and the third input terminal; and a clamp circuit, clamping a voltage of the third input terminal to a predetermined voltage.

18 Claims, 6 Drawing Sheets

(58) Field of Classification Search
USPC ................ 323/271–276, 282–287, 351, 908;
136/205
See application file for complete search history.

(56) References Cited

U.S. PATENT DOCUMENTS

2004/0176859 A1   9/2004  Chian et al.
2010/0208498 A1*  8/2010  Rubio ................. H02M 3/1563
363/18

\* cited by examiner

CONTROLLER AND SELF-OSCILLATION DC-DC CONVERTER INCLUDING THE CONTROLLER

CROSS-REFERENCE TO RELATED APPLICATION

This application claims the priority benefits of Japanese application no. 2023-039284, filed on Mar. 14, 2023, and Japanese application no. 2023-169283, filed on Sep. 29, 2023. The entirety of each of the above-mentioned patent applications is hereby incorporated by reference herein and made a part of this specification.

BACKGROUND

Technical Field

The present invention relates to a controller and a self-oscillation DC-DC converter including the controller.

Description of Related Art

A conventional self-oscillation DC-DC converter having a primary side connected to a thermal power generation device which is an example of a power supply device, for example, includes a transformer and a capacitor, and a resonant circuit is formed with the coil (inductor) of the secondary winding of the transformer and the capacitor. Further, the conventional self-oscillation DC-DC converter further includes a rectifying element and a switching element. A diode, which is the rectifying element, is connected to a positive terminal which is a terminal on one side of the secondary winding of the transformer. A depletion type field effect transistor (hereinafter referred to as "FET"), which conducts even though the gate-source voltage is 0 (zero) V, is applied to a transistor corresponding to a switching element.

The conventional self-oscillation DC-DC converter configured in this way is self-oscillated by the resonant circuit formed by the coil of the secondary winding of the transformer and the capacitor, and rectified by the diode to supply DC voltage.

A thermal power generation device generally generates a voltage proportional to a temperature difference applied to the thermal power generation device, so the lower the temperature difference applied to the thermal power generation device, the smaller the power generating voltage is. In thermal power generation using a thermal power generation device, for example, the energy is desirable to be able to generate electricity even at a small power generating voltage of about 100 mV. When using the small power generating voltage, the turn ratio of the coil of the transformer is required to be somewhat large. For example, a turn ratio of 50 for an input voltage on the primary side of a transformer of 100 mV may generate an output voltage on the secondary side of the transformer of 5 V.

There is also a technology to increase the drive capability of the transistor as a switching element, by connecting a MOS transistor or a bipolar transistor in parallel to the depletion type FET as a switching element.

Generally, in a case where extracting power from a voltage source that includes an internal resistor with a resistance value R0, the maximum power may be extracted in the case that the real number part (resistance value) R of the impedance of the load connected to the voltage source is equal to the resistance value R0 (R=R0). In the case that the power supply device to be connected in advance has almost no variation in the resistance value of the internal resistor, and the resistance value is known, it is also possible to design a DC-DC converter capable of extracting the maximum power according to that resistance value.

However, in the case that a power supply device including an internal resistor that varies in resistance value, such as a thermal power generation device, is connected to the primary side of the conventional DC-DC converter described above to transmit power to the secondary side, the variation in resistance value of the internal resistor causes the power conversion efficiency to also vary.

The description is supplemented by taking a thermal power generation device as an example. The thermal power generation device includes a thermal power generation element including an internal resistor. The resistance value of the internal resistor of the thermal power generation element varies depending on the structure, size, etc. of the thermal power generation element. Thus, even for the thermal power generation devices related to the same product, there is variation in the resistance value of the internal resistors depending on the individuals of the thermal power generation elements of the thermal power generation device, and even if one thermal power generation device is designed to be capable of extracting the maximum power, other thermal power generation devices may have a reduced power conversion efficiency, that is, a large power loss.

The present invention has been made to solve the above-mentioned problems and is aimed to provide a controller and a self-oscillation DC-DC converter including the controller that is capable of maximizing power conversion efficiency according to the resistance value of the internal resistor even in the case that there is a variation in the resistance value of the internal resistor depending on the individuals of the power generation elements of the power supply device to be connected.

SUMMARY

The controller according to at least one aspect of the present invention includes: a first input terminal; a second input terminal; a third input terminal; an output terminal; a switching element circuit, including a first depletion type field effect transistor and at least one field effect transistor containing a gate connected to a gate of the first depletion type field effect transistor, a source connected to a source of the first depletion type field effect transistor, and a drain, the at least one field effect transistor including a plurality of enhancement type field effect transistors; a first connector, including each terminal respectively connected to a drain of at least one depletion type field effect transistor included in the switching element circuit; a second connector, including each terminal respectively connected to a drain of the enhancement type field effect transistor included in the switching element circuit; a first rectifying element, connected between the first input terminal and the second input terminal with a direction from the second input terminal to the first input terminal as a forward direction; a second rectifying element, provided between a connection point between the first input terminal and the first rectifying element and the output terminal with a direction from the connection point to the output terminal as a forward direction; a resistor, having a first end connected to a gate of the first depletion type field effect transistor and the third input terminal and a second end connected to the second input terminal; and a clamp circuit, clamping a voltage of the third input terminal to a predetermined voltage.

A self-oscillation DC-DC converter according to at least one aspect of the present invention includes: the controller; and a transformer, including: a primary side first terminal; a primary side second terminal; a secondary side first terminal; and a secondary side second terminal. The primary side second terminal is connected to any one of multiple terminals included in the first connector, and the secondary side first terminal is connected to the third input terminal through a first capacitor and to the first input terminal through a second capacitor.

According to the controller and the self-oscillation DC-DC converter including the controller, the DC-DC converter may be operated with high power conversion efficiency regardless of the individuals of the power supply devices to be connected even in the case that a power supply device with a variation in the resistance value of the internal resistor is connected to the primary side of the DC-DC converter.

DESCRIPTION OF THE EMBODIMENTS

The controller and the self-oscillation DC-DC converter according to the embodiment of the present invention is described below with reference to the drawings.

Figure 1:
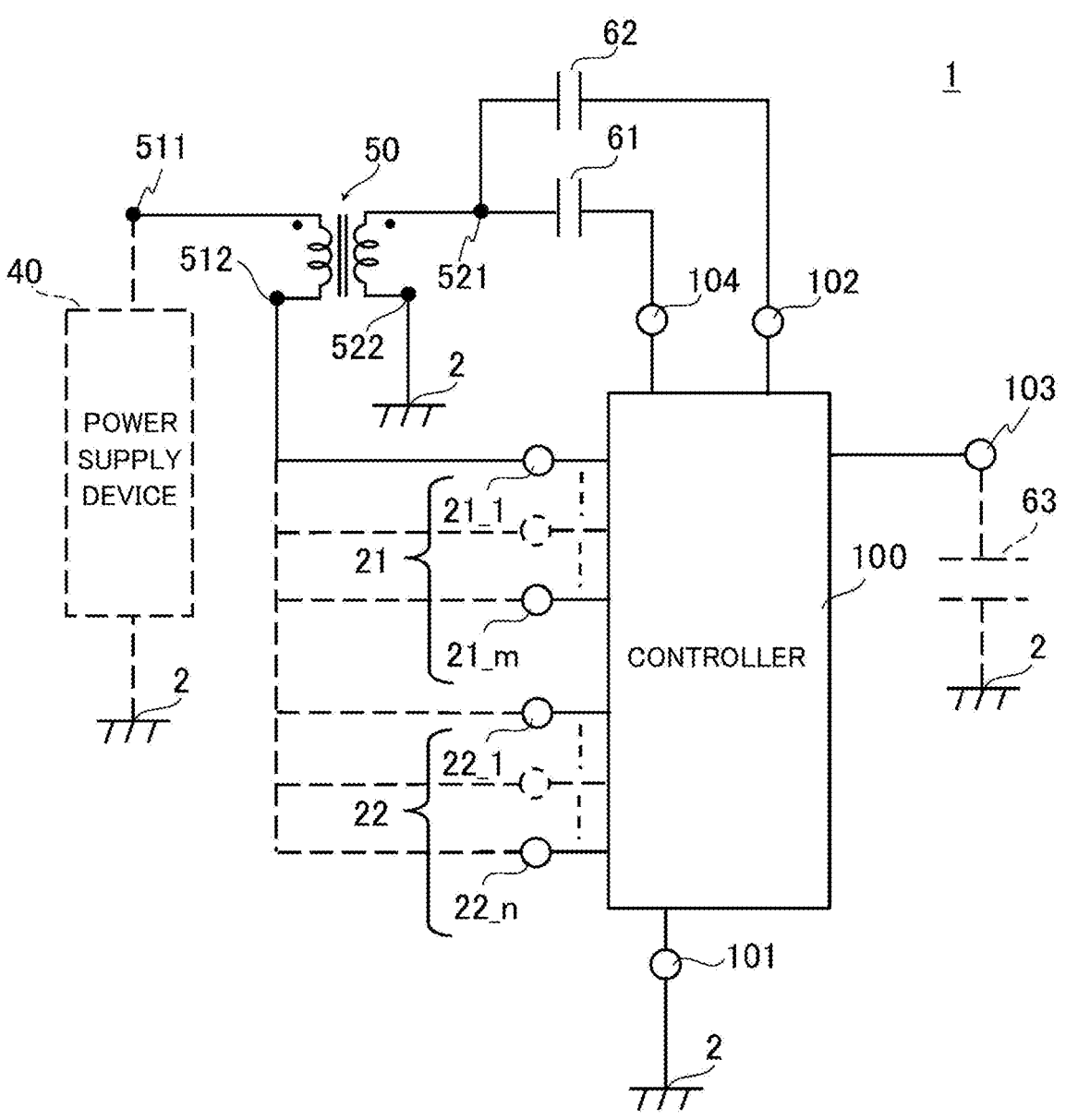
FIG. 1 is a circuit diagram of the controller and the self-oscillation DC-DC converter according to the embodiment of the present invention.

FIG. 1 is a circuit diagram of a DC-DC converter 1 which is an example of the self-oscillation DC-DC converter according to the embodiment of the present invention.

The DC-DC converter 1 includes a controller 100 and a transformer 50. The controller 100 includes: a GND terminal 101, input terminals 102 and 104, an output terminal 103, m (natural number) connection terminals 21_1 to 21_m, and n (multiple) connection terminals 22_1 to 22_n. Here, in the case that m connection terminals 21_1 to 21_m are comprehensively described, the branch numbers are omitted and they are referred to as the "connection terminal 21." Similar to the connection terminal 21, in the case that the n connection terminals 22_1 to 22_n are comprehensively described, they are referred to as the "connection terminal 22."

For example, the DC-DC converter 1 is used such that a primary side first terminal 511 of the transformer 50 is connected to the power supply device, and the output terminal 103 is connected to a capacitor 63 which is a capacitive element capable of storing electricity. The power supply device to be connected is, for example, a device including a power generation element including an internal resistor, such as a thermal conversion element (thermoelectric generator) (hereinafter referred to as "TEG") 40 or a power generation element including an internal resistor.

A primary side second terminal 512 of the transformer 50 is connected to any one of the connection terminals 21_1 to 21_m, such as the connection terminal 21_1. Further, the primary side second terminal 512 is connected to at least one of the other connection terminals 21_2 to 21_m and the connection terminals 22_1 to 22_n.

The secondary side first terminal 521 of the transformer 50 is connected to the input terminal 104 through the capacitor 61 as the first capacitor, and to the input terminal 102 through a capacitor 62 as the second capacitor. A secondary side second terminal 522 of the transformer 50 is connected to the grounding terminal 2.

Figure 2:
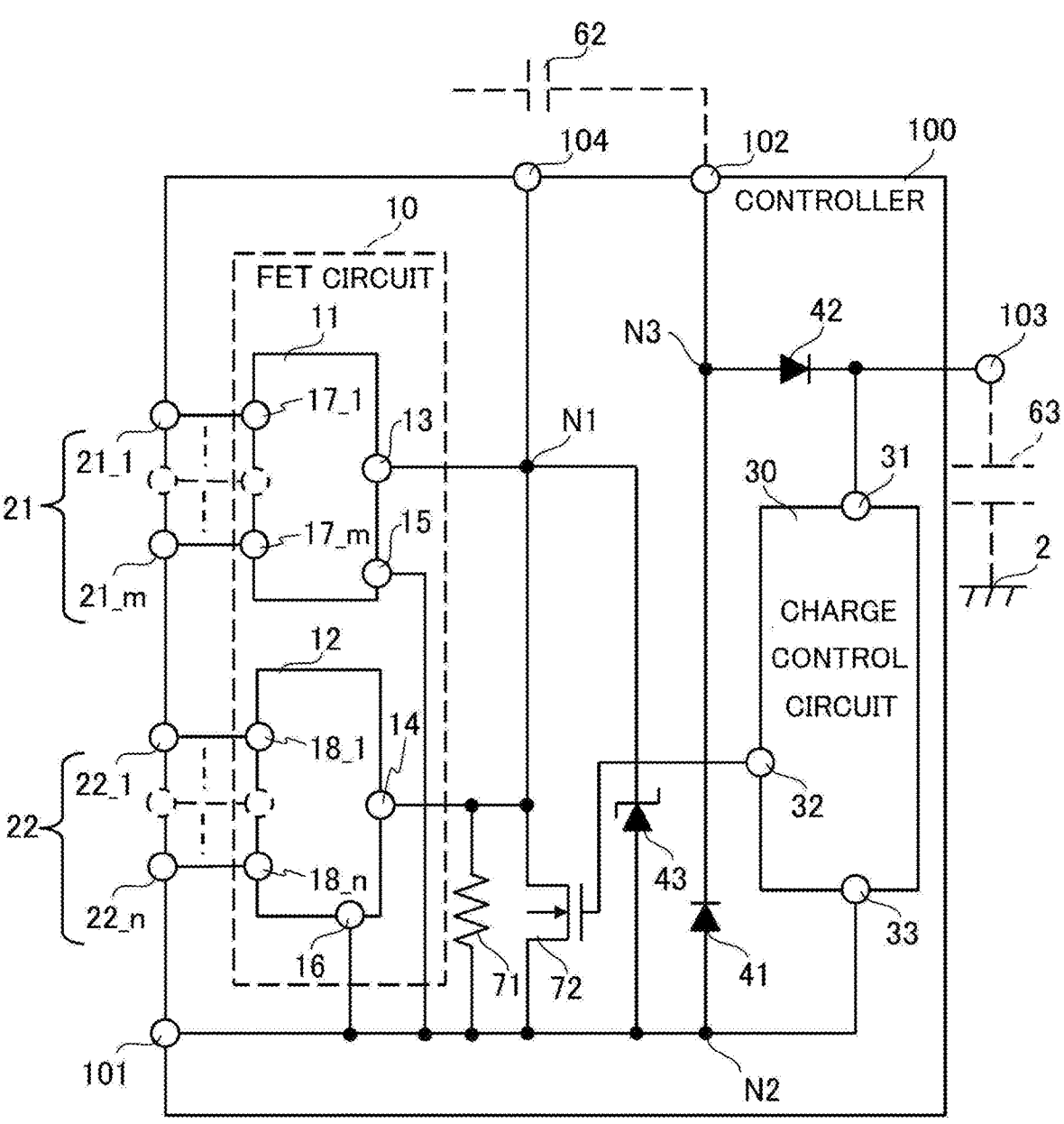
FIG. 2 is a circuit diagram of the controller according to this embodiment.

FIG. 2 is a circuit diagram of the controller 100 which is an example of the controller according to the embodiment of the present invention.

In addition to the GND terminal 101, the input terminals 102 and 104, the output terminal 103, the connection terminals 21_1 to 21_m, and the connection terminals 22_1 to 22_n, the controller 100 includes an FET circuit 10, a charge control circuit 30, diodes 41 and 42, a clamp circuit 43, a resistor 71, and an N-type MOS transistor (hereinafter referred to as "NMOS transistor") 72 which is an example of a FET.

The FET circuit 10 includes a depletion type FET circuit 11 including m depletion type FETs (hereinafter referred to as "DFET") and an enhancement type FET circuit 12 including n enhancement type FETs (hereinafter referred to as "EFET").

The DFET circuit 11 includes a first input end 13 connected to the input terminal 104 as the third input terminal, a second input end 15 connected to the GND terminal 101 as the second input terminal, and connection ends 17_1 to 17_m connected to m connection terminals 21_1 to 21_m, respectively. Here, the connection point between the first input end 13 and the input terminal 104 is called a node N1, and the connection point between the second input end 15 and the GND terminal 101 is called a node N2.

The EFET circuit 12 includes a first input end 14 connected to the input terminal 104 at the node N1, a second input end 16 connected to the GND terminal 101 at the node N2, and connection ends 18_1 to 18_n connected to n connection terminals 22_1 to 22_n, respectively.

The charge control circuit 30 includes a first input end 31 connected to the output terminal 103, a second input end 33 connected to the GND terminal 101, and an output end 32 outputting the control signal.

The diode 41, as the first rectifying element, is connected between the input terminal 102 as the first input terminal, and the GND terminal 101 with a direction from the GND terminal 101 to the input terminal 102 as a forward direction. The diode 42, as the second rectifying element, is connected between a node N3 which is the connection point between the input terminal 102 and the cathode of the diode 41, and the output terminal 103 with a direction from the node N3 to the output terminal 103 as a forward direction.

That is, the diode 41 includes an anode connected to the node N2 and a cathode connected to the node N3. The diode 42 includes an anode connected to the node N3 and a cathode connected to the output terminal 103. Further, the cathode of the diode 42 is further connected to the first input end 31 of the charge control circuit 30.

The resistor 71 is connected between the node N1 and the node N2. The NMOS transistor 72 is connected in parallel with the resistor 71. Further, the gate of the NMOS transistor 72 is connected to the output end 32 of the charge control circuit 30. That is, the NMOS transistor 72 includes a drain connected to the node N1, a gate connected to the output end 32, and a source connected to the node N2.

The clamp circuit 43 is a circuit that clamps the positive side voltage of the node N1 to a predetermined value and includes a first end connected to the node N1 and a second end connected to the node N2. The clamp circuit 43 includes, for example, a Zener diode including an anode connected to the node N2 and a cathode connected to the node N1.

To control the voltage (Vgs-Vt) to a certain value, the controller 100 is provided with the clamp circuit 43. Here, the voltage (Vgs-Vt) is the difference between the gate-source voltage Vgs and the threshold voltage Vt of the FETs in the FET circuit 10. Since the resistance value Ron of the on-resistance in the non-saturation region of the MOSFET may be expressed by Equation (1) below, in response to the voltage (Vgs-Vt) being able to be controlled to a certain value, by adjusting the size of the MOSFET, that is, the ratio of the gate width W to the gate length L (=W/L), the resistance value Ron may be adjusted. According to Equation (1) below, in the case that the voltage (Vgs-Vt) is regarded as a constant, the resistance value Ron is inversely proportional to W/L (proportional to the gate length L and inversely proportional to the gate width W).

[Equation 1]

$$Ron = \frac{1}{\mu \cdot Cox \cdot \dfrac{W}{L} \cdot (Vgs - Vt)} \quad (1)$$

Figure 3:
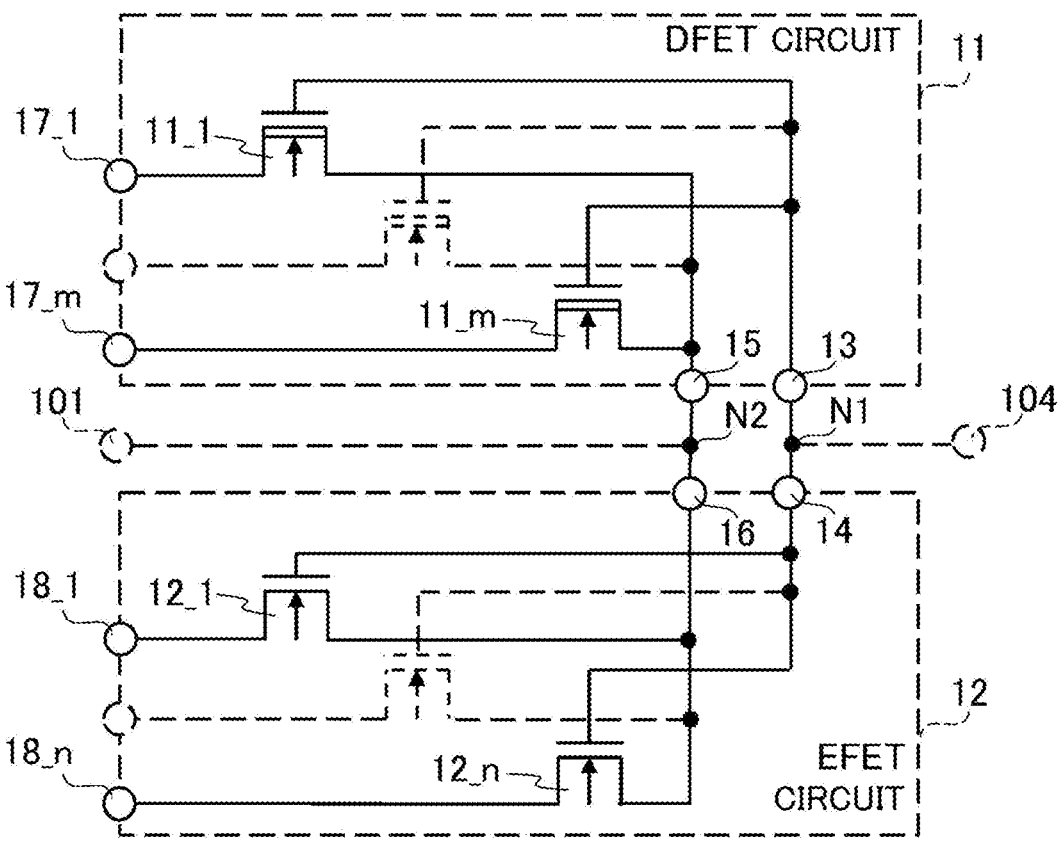
FIG. 3 is a circuit diagram of the FET circuit included in the controller according to this embodiment.

$\mu$: Electron mobility $Cox$: Gate capacitance per unit area $W$: Gate width $L$: Gate length $Vgs$: Gate−source voltage $Vt$: Threshold voltage FIG. 3 is a circuit diagram illustrating a more detailed configuration of the FET circuit 10 including the DFET circuit 11 and the EFET circuit 12.

The DFET circuit 11 includes m depletion type NMOS transistors 11_1 to 11_m which are examples of the DFETs. The depletion type NMOS transistor 11_1, as the first depletion type field effect transistor, includes a gate connected to the first input node 13, a source connected to the second input node 15, and a drain connected to the connection node 17_1.

Similar to the depletion type NMOS transistor 11_1, the depletion type NMOS transistors 11_2 to 11_m have gates connected to the first input node 13 and sources connected to the second input node 15. The drains of the depletion type NMOS transistors 11_2 to 11_m are connected to the connection nodes 17_2 to 17_m, respectively. That is, the depletion type NMOS transistors 11_1 to 11_m have their gates connected to each other through the node N1 and their sources connected to each other through the node N2. Then, the drains of the depletion type NMOS transistors 11_1 to 11_m are connected to the connection nodes 17_1 to 17_m, respectively.

The depletion type NMOS transistors 11_1 to 11_m are configured with different sizes. Among the depletion type NMOS transistors 11_1 to 11_m, in response to the ratio "Wd1/Ld1" of the gate width Wd1 to the gate length Ld1 of the smallest transistor being set as the reference (=1), the size ratio of the depletion type NMOS transistors 11_1 to 11_m is, for example, formed to a power of 2, i.e., 1 (=$2^0$): 2(=$2^1$): . . . : $2^{m-1}$.

Further, in order to enable the depletion type NMOS transistors 11_1 to 11_m to transition to the off state, the threshold voltage is set higher than −0.6V (lower in the absolute value). This is because the negative side voltage (low-side voltage) of the node N1 is clamped at about −0.6V by the parasitic diode of the NMOS transistor 72.

The EFET circuit 12 includes n enhancement type NMOS transistors 12_1 to 12_n, which are examples of the EFETs. Similar to the depletion type NMOS transistors 11_1 to 11_m, the enhancement type NMOS transistors 12_1 to 12_n have their gates connected to each other through the node N1 and their sources connected to each other through the node N2. Then, the drains of the enhancement type NMOS transistors 12_1 to 12_n are connected to the connection nodes 18_1 to 18_n, respectively. That is, the enhancement type NMOS transistors 12_1 to 12_n include gates connected to the first input node 14, sources connected to the second input node 16, and drains connected to the connection nodes 18_1 to 18_n, respectively.

The enhancement type NMOS transistors 12_1 to 12_n are configured with different sizes. Among the enhancement type NMOS transistors 12_1 to 12_n, in response to the ratio "We1/Le1" of the gate width We1 to the gate length Le1 of the smallest transistor being set as the reference (=1), the size ratio of the enhancement type NMOS transistors 12_1 to 12_n is, for example, formed to a power of 2, i.e., 1:2: . . . :$2^{n-1}$.

Figure 4:
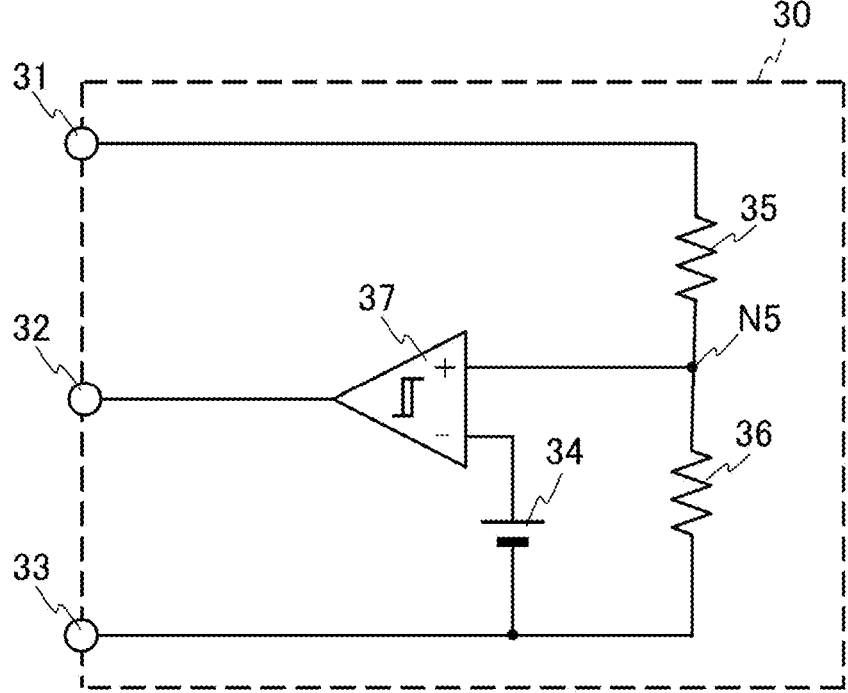
FIG. 4 is a circuit diagram of the charge control circuit included in the controller according to this embodiment.

FIG. 4 is a circuit diagram showing a more detailed configuration of the charge control circuit 30.

The charge control circuit 30 includes a first input node 31, a second input node 33, an output node 32, a reference voltage source 34 supplying the reference voltage, resistors 35 and 36, and a hysteresis comparator 37 having hysteresis characteristics.

The reference voltage source 34 has a first end that supplies the reference voltage and a second end that is connected to the second input node 33.

The resistor 35 and the resistor 36 are connected in series and form a resistance voltage division circuit. The resistors 35 and 36 connected in series are connected between the first input node 31 and the second input node 33, and are capable of obtaining a divided voltage of the voltage applied between the first input node 31 and the second input node 33.

The hysteresis comparator 37 includes a non-inverting input terminal (+) connected to the node N5 which is a connection point between the resistors 35 and 36, an inverting input terminal (−) connected to the first end of the reference voltage source 34, and an output terminal connected to the output node 32 of the charge control circuit 30.

Next, the function and effects of the controller 100 and the DC-DC converter 1 configured as described above is now described using the case where a TEG 40 is connected to the primary side first terminal 511 of the transformer 50 and the capacitor 63 is connected to the output terminal 103.

The controller 100 selects one or more terminals from the connection terminals 21_1 to 21_m and the connection terminals 22_1 to 22_n to be connected to the primary side second terminal 512 of the transformer 50, including at least one of the connection terminals 21_1 to 21_m. In the controller 100, by selecting at least one from the connection terminals 21_1 to 21_m, at least one of the DFETs 11_1 to 11_m is connected to the primary side second terminal 512. Further, by selecting and using one or more from the connection terminals 22_1 to 22_n, an EFET may be further connected in parallel to the DFET connected to the primary side second terminal 512.

Here, to select which of the connection terminals 21_1 to 21_m and the connection terminals 22_1 to 22_n is to be connected to the primary side second terminal 512 of the transformer 50, for example, the ratio of the gate width W to the gate length L (=W/L) of the DFETs 11_1 to 11_m and the EFETs 12_1 to 12_n, the resistance value of the on-resistance of the DFETs 11_1 to 11_m and the EFETs 12_1 to 12_n, and the resistance value of the internal resistor of the TEG 40 are to be considered in making the decision. To obtain high power conversion efficiency, the value of the real number part of the impedance of the DC-DC converter 1, which is the load, is advantageous to be close to the resistance value of the internal resistor of the TEG40.

In this way, after connecting the connection terminal selected from the connection terminals 21_1 to 21_m and the connection terminal 22_1 to 22_n to the primary side second terminal 512 of the transformer 50, as the TEG 40 starts to operate, the DC-DC converter 1 starts the self-oscillation by the resonant circuit that resonates at a period determined by the inductance of the secondary winding of the transformer 50 and the capacitance of capacitor 61. As the self-oscillation starts, electricity supplied from the TEG 40 is stored in the capacitor 63 via the secondary side of the transformer 50 and the controller 100.

In the DC-DC converter 1, a Cockcroft-Walton type voltage doubling circuit is formed by the capacitor 62, the diode 41, and the diode 42. Thus, the voltage appearing at the output terminal 103 is doubled with respect to the secondary side voltage appearing between the secondary side first terminal 521 and the secondary side second terminal 522 of the transformer 50.

Further, the voltage between the first input end 31 and the second input end 33 in the charge control circuit 30 increases or decreases as the output voltage Vo appearing at the output terminal 103 increases or decreases. The voltage VN5 of the node N5, which is received by the non-inverting input terminal (+) of the hysteresis comparator 37, fluctuates as the voltage between the first input end 31 and the second input end 33 fluctuates. Here, the operation of the hysteresis comparator 37 is described using the voltage VN5 of the node N5, the micro-voltage a, and the reference voltage Vref supplied from the reference voltage source 34.

The hysteresis comparator 37 compares the voltage VN5 received by the non-inverting input terminal (+) with the reference voltage Vref received by the inverting input terminal (−) and outputs a control signal including one of two signal levels, for example, a high (hereinafter referred to as "H") level or a low (hereinafter referred to as "L") level. In the case that VN5>Vref+α, an H level control signal is output from the output end of the hysteresis comparator 37. On the other hand, in the case that VN5<Vref−α, an L level control signal is output from the output end of the hysteresis comparator 37.

The control signal from the hysteresis comparator 37 is supplied from the output end 32 to the gate of the NMOS transistor 72. In response to an H level control signal being supplied to the gate of the NMOS transistor 72, the NMOS transistor 72 is turned on, the gate voltages of the DFETs 11_1 to 11_m and the EFETs 12_1 to 12_n are lowered to the same voltage as the node N2, that is, the ground voltage, and self-oscillation is stopped (oscillation stopped state). On the other hand, in response to an L level control signal being supplied to the gate of the NMOS transistor 72, the NMOS transistor 72 is turned off and starts self-oscillation.

By supplying the control signal to the gate of the NMOS transistor 72 to switch between on and off states, the charge control circuit 30 controls the DC-DC converter 1 to be switched between the oscillation operating state and the oscillation stopped state so that the output voltage Vo is within the range of Vref−α≤Vo≤Vref+α.

To clamp the voltage of each of the gates of the DFETs 11_1 to 11_m and the EFETs 12_1 to 12_n, that is, the positive side voltage (high-side voltage) of the node N1, to a predetermined value, the clamp circuit 43 controls the voltage (Vgs-Vt) to a certain value. On the other hand, the negative side voltage (low-side voltage) of the node N1 is clamped at about −0.6 V by the parasitic diode of NMOS transistor 72 and is not allowed to be lower (larger in absolute value) than about −0.6 V.

As described above, according to the controller 100 and the DC-DC converter 1 including the controller 100, the size of the FET, which is a switching element, may be selectively switched according to the resistance value of the internal resistor of the power supply device connected to the primary side of the DC-DC converter 1. Thus, even in the case that a power supply device with variation in the resistance value of the internal resistor is connected to the primary side of the DC-DC converter 1, the DC-DC converter 1 may be operated with high power conversion efficiency regardless of the individuals of the power supply devices to be connected.

In addition, the controller 100 includes the NMOS transistor 72, and by switching between turned on and turned off of the EFETs 12_1 to 12_n, self-oscillation of the DC-DC converter 1 may be switched on and off. That is, on/off control of self-oscillation of the DC-DC converter 1 becomes possible. The controller 100 further includes the charge control circuit 30, on/off control of self-oscillation of the DC-DC converter 1 according to the high or low voltage of the output terminal 103 becomes possible, and the voltage value of the output terminal 103 may be controlled to a certain range.

By setting the size ratio of the DFETs 11_1 to 11_m, that is, the ratio of the gate width W and the gate length L (=W/L) to different powers of 2, the size adjustment of the DFET connected to the DC-DC converter 1 may be facilitated. For example, by setting the size ratio of the three DFETs 11_1 to 11_3 to 1:2:4, the size of the DFET connected to the DC-DC converter 1 may be adjusted in seven stages from 1 to 7. Similar to the size ratio of the DFETs 11_1 to 11_m, by setting the size ratio of the EFETs 12_1 to 12_n to different powers of 2, the size adjustment of the EFET connected to the DC-DC converter 1 may be facilitated.

Further, the integration of the DFETs 11_1 to 11_m and the EFETs 12_1 to 12_n allows the same to be more compact and have more precisely matched size ratios than the case of being formed by discrete elements, thereby facilitating and improving accuracy of size adjustment of the DFETs 11_1 to 11_m and the EFETs 12_1 to 12_n, and thus impedance adjustment of the DC-DC converter 1.

In addition, the integration of the circuits, including the clamp circuit 43, facilitates the inverse proportion of the on-resistance of the DFETs 11_1 to 11_m and the EFETs 12_1 to 12_n to the gate width W, thereby further facilitating and improving the accuracy of the impedance adjustment of the DC-DC converter 1.

Furthermore, by integrating the circuit including the diode 41 including an anode connected to the GND terminal 101 and a cathode connected to the input terminal 102, and the diode 42 including an anode connected to the node N3 and a cathode connected to the output terminal 103, in application with the capacitor 63 connected between the output terminal 103 and the ground terminal 2, the capacitor 62, the diode 41, and the diode 42 connected to the input terminal 102 form a Cockcroft-Walton type voltage doubling circuit to obtain higher voltages.

It is noted that the present invention is not limited to the above-described embodiment as it is, but can be implemented in various forms other than the examples described above at the implementation stage, and various omissions, additions, substitutions, or changes can be made to the extent that they do not depart from the gist of the present invention.

For example, the controller according to this embodiment may be a controller 200 (see FIG. 5) including a clamp circuit 45 instead of the clamp circuit 43 of the controller 100 including the clamp circuit 43 or a controller 300 (see FIG. 6) including a clamp circuit 46 instead of the clamp circuit 43 or the clamp circuit 45.

Figure 5:
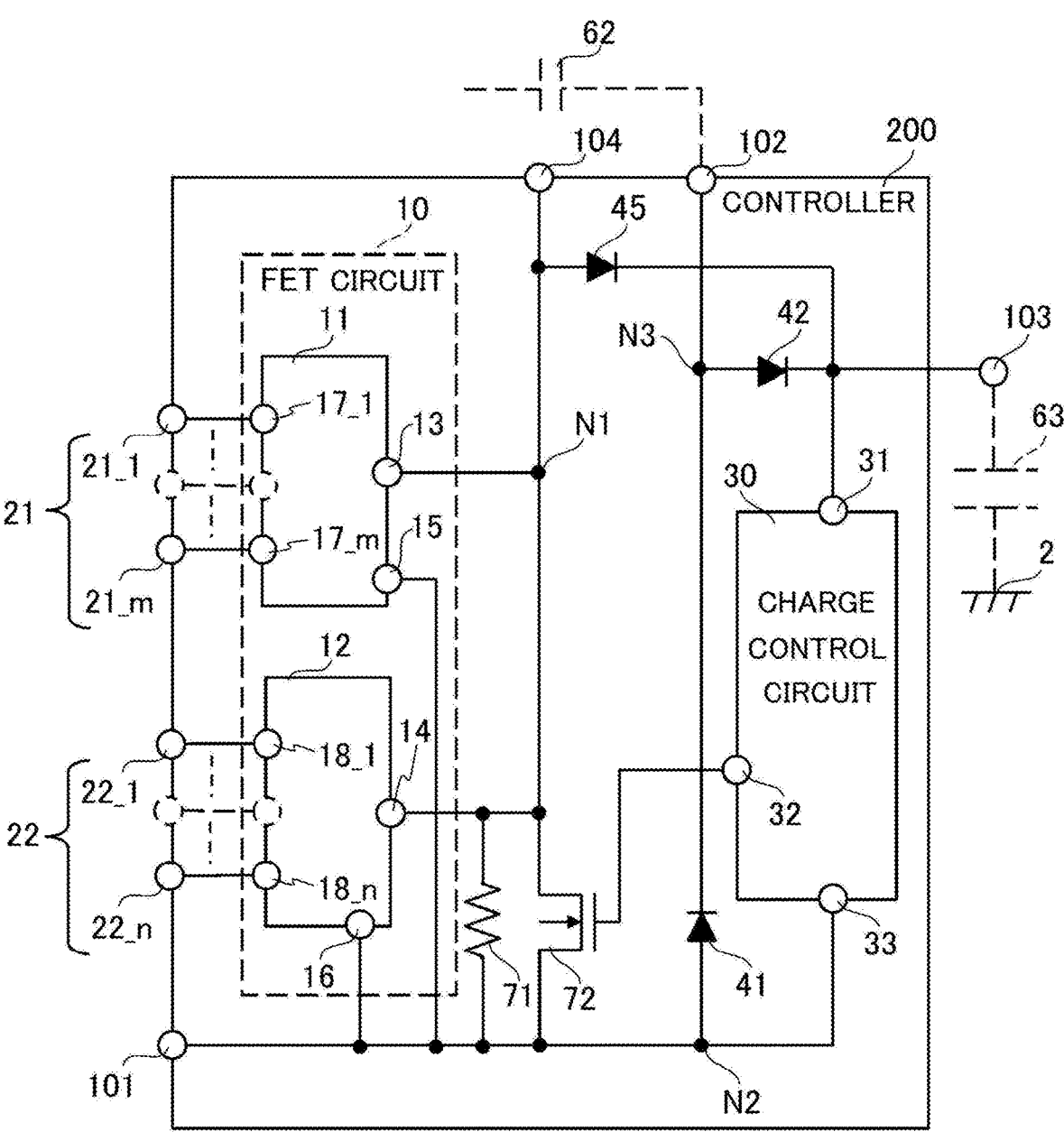
FIG. 5 is a circuit diagram illustrating the configuration of the first modified example of the controller according to this embodiment.
Figure 6:
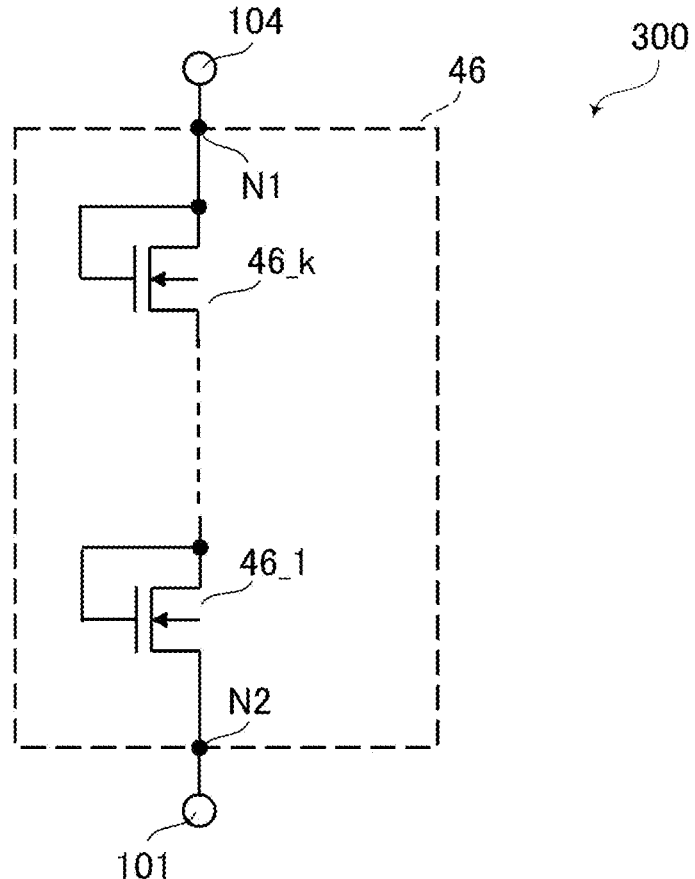
FIG. 6 is a circuit diagram illustrating the configuration of the second modified example of the controller according to this embodiment.

FIG. 5 and FIG. 6 are circuit diagrams illustrating the configuration of the controller 200 corresponding to a first modified example of the controller 100, and the controller 300 corresponding to a second modified example of the controller 100, respectively.

Similar to the clamp circuit 43, the clamp circuit 45 (see FIG. 5) is a circuit that clamps the positive side voltage of the node N1 to a predetermined value. The clamp circuit 45 includes, for example, a rectifying element such as a diode including an anode connected to the input terminal 104 (node N1) and a cathode connected to the output terminal 103. In the controller 200 including one diode as the clamp circuit 45 instead of the clamp circuit 43, the voltage at the input terminal 104, that is, the node N1, is clamped to the voltage at the output terminal 103+about 0.6 V.

The clamp circuit 46 illustrated in FIG. 6 includes MOS-FETs 46_1 to 46_k connected to k gates and drains, which are the so-called diode-connected MOSFETs, connected in series instead of the clamp circuit 43. Here, k is a natural number (k≥1). That is, the clamp circuit 46 includes k diode-connected MOSFETs 46_1 to 46_k connected in series. It is noted that the above-mentioned clamp circuit 46 may be applied instead of the clamp circuit 45. In FIG. 6, in which the GND terminal 101 is read as the input terminal 104 and the input terminal 104 is read as the output terminal 103, FIG. 6 as read corresponds to a circuit diagram illustrating the configuration of the controller 300 with the clamp circuit 46 replacing the clamp circuit 45.

In this embodiment, the controller 100 including the NMOS transistor 72 and the charge control circuit 30 has been described as an example, but the controller 100 is not limited thereto. The controller according to this embodiment may be, for example, a controller 100 omitting the charge control circuit 30 from the controller 100 illustrated in FIG. 1, or a controller 100 omitting the NMOS transistor 72 and the charge control circuit 30. Further, the controller 100 may be replaced with the controller 200 or the controller 300.

In addition, although the FET circuit 10 including the DFET circuit 11 and the EFET circuit 12 has been described as an example, the FET circuit 10 may have a configuration including multiple DFETs without an EFET, that is, it may be a DFET circuit 11. In this case, since the FET circuit 10 may be configured only with the same depletion type FETs, there is an advantage that the number of elements may be reduced.

In this embodiment, an example in which a diode is applied as a rectifying element has been described, but it is not limited to diodes as long as the element enables synchronous rectification in the DC-DC converter 1. For example, in addition to diodes, FETs and the like may be applied. Further, the MOS transistor shown as an example of the FET may be replaced by a different type of FET than a MOSFET, such as a junction-type FET (JFET) or a metal-insulator-semiconductor-type FET (MISFET).

These embodiments and their modifications are included within the scope and gist of the present invention, as well as within the scope of the present invention described in the claims and its equivalents.

What is claimed is:

1. A controller, comprising:
a first input terminal;
a second input terminal;
a third input terminal;
an output terminal;
a switching element circuit, including a first depletion type field effect transistor and at least one field effect transistor containing a gate connected to a gate of the first depletion type field effect transistor, a source connected to a source of the first depletion type field effect transistor, and a drain, the at least one field effect transistor including a plurality of enhancement type field effect transistors;
a first connector, including a terminal connected to a drain of the first depletion type field effect transistor included in the switching element circuit;
a second connector, including each terminal respectively connected to a drain of the plurality of the enhancement type field effect transistors included in the switching element circuit;
a first rectifying element, connected between the first input terminal and the second input terminal with a direction from the second input terminal to the first input terminal as a forward direction;
a second rectifying element, connected between a connection point between the first input terminal and the first rectifying element and the output terminal with a direction from the connection point to the output terminal as a forward direction;
a resistor, having a first end connected to a gate of the first depletion type field effect transistor and the third input terminal and a second end connected to the second input terminal; and
a clamp circuit, clamping a voltage of the third input terminal to a predetermined voltage.

2. The controller according to claim 1, further comprising:
a second field effect transistor connected in parallel with the resistor.

3. The controller according to claim 2, further comprising:
a control circuit, generating a control signal for any one of a first signal level and a second signal level based on whether a voltage difference between a voltage of the second input terminal and a voltage of the output terminal is larger than a reference voltage and supplying the control signal to a gate of the second field effect transistor.

4. The controller according to claim 2, further comprising a control circuit,
wherein the control circuit comprises:
a resistor divider circuit coupled between the output terminal and the second input terminal; and
a comparator comparing a divided voltage from a node of the resistor divider circuit with a reference voltage, the comparator comprising an output terminal of the comparator coupled to the gate of the second field effect transistor.

5. The controller according to claim 1, wherein in response to a ratio Wd1/Ld1 of a gate width Wd1 to a gate length Ld1 of the first depletion type field effect transistor being set as a reference, the first depletion type field effect transistor of the switching element circuit is configured such that a ratio of a gate width to a gate length is a power of 2 relative to the ratio Wd1/Ld1.

6. The controller according to claim 1, wherein in response to the switching element circuit comprising at least one enhancement type field effect transistor including a first enhancement type field effect transistor and a ratio We1/Le1 of a gate width We1 to a gate length Le1 of the first enhancement type field effect transistor being set as a reference, the first enhancement type field effect transistor of the switching element circuit is configured such that a ratio of a gate width to a gate length is a power of 2 relative to the ratio We1/Le1.

7. The controller according to claim 1, wherein the first rectifying element, the second rectifying element, the field effect transistor of the switching element circuit, and the clamp circuit are integrated as an integrated circuit.

8. A self-oscillation DC-DC converter, comprising:

the controller according to claim 1; and a transformer, including:

a primary side first terminal;

a primary side second terminal, connected to any one of each terminal included in the first connector; a secondary side first terminal, connected to the third input terminal through a first capacitor and to the first input terminal through a second capacitor; and a secondary side second terminal.

9. The controller according to claim 1, wherein the first depletion type field effect transistor comprises a drain coupled to the terminal of the first connector, and the plurality of the enhancement type field effect transistors coupled in parallel with the first depletion type field effect transistor respectively comprises a drain coupled to each terminal of the second connector.

10. The controller according to claim 1, wherein the first connector and the second connector are structurally separated from each other to allow selective connection to a primary side of a power supply device based on an internal resistance of the power supply device.

11. The controller according to claim 1, wherein the first connector and the second connector are isolated from each other.

12. A controller, comprising:

a first input terminal;

a second input terminal;

a third input terminal;

an output terminal;

a switching element circuit, including a first depletion type field effect transistor and at least one field effect transistor containing a gate connected to a gate of the first depletion type field effect transistor, a source connected to a source of the first depletion type field effect transistor, and a drain, the at least one field effect transistor including a second depletion type field effect transistor and at least one enhancement type field effect transistor;

a first connector, including each terminal respectively connected to a drain of the first and second depletion type field effect transistors included in the switching element circuit;

a second connector, including each terminal respectively connected to a drain of the at least one enhancement type field effect transistor included in the switching element circuit;

a first rectifying element, connected between the first input terminal and the second input terminal with a direction from the second input terminal to the first input terminal as a forward direction;

a second rectifying element, connected between a connection point between the first input terminal and the first rectifying element and the output terminal with a direction from the connection point to the output terminal as a forward direction;

a resistor, having a first end connected to a gate of the first depletion type field effect transistor and the third input terminal and a second end connected to the second input terminal; and a clamp circuit, clamping a voltage of the third input terminal to a predetermined voltage.

13. The controller according to claim 12, further comprising: a second field effect transistor connected in parallel with the resistor.

14. The controller according to claim 13, further comprising: a control circuit, generating a control signal for any one of a first signal level and a second signal level based on whether a voltage difference between a voltage of the second input terminal and a voltage of the output terminal is larger than a reference voltage and supplying the control signal to a gate of the second field effect transistor.

15. The controller according to claim 12, wherein in response to a ratio Wd1/Ld1 of a gate width Wd1 to a gate length Ld1 of the first depletion type field effect transistor being set as a reference, the first depletion type field effect transistor of the switching element circuit is configured such that a ratio of a gate width to a gate length is a power of 2 relative to the ratio Wd1/Ld1.

16. The controller according to claim 12, wherein in response to the switching element circuit comprising at least one enhancement type field effect transistor including a first enhancement type field effect transistor and a ratio We1/Le1 of a gate width We1 to a gate length Le1 of the first enhancement type field effect transistor being set as a reference, the first enhancement type field effect transistor of the switching element circuit is configured such that a ratio of a gate width to a gate length is a power of 2 relative to the ratio We1/Le1.

17. The controller according to claim 12, wherein the first rectifying element, the second rectifying element, the field effect transistor of the switching element circuit, and the clamp circuit are integrated circuits.

18. A self-oscillation DC-DC converter, comprising:

the controller according to claim 12; and a transformer, comprising: a primary side first terminal; a primary side second terminal, connected to any one of each terminal included in the first connector; a secondary side first terminal, connected to the third input terminal through a first capacitor and to the first input terminal through a second capacitor; and a secondary side second terminal.

* * * * *